(12) United States Patent
Garcia et al.

(10) Patent No.: US 8,305,104 B2
(45) Date of Patent: Nov. 6, 2012

(54) TESTING AND SORTING SYSTEM HAVING A LINEAR TRACK AND METHOD OF USING THE SAME

(75) Inventors: Douglas Garcia, Beaverton, OR (US); Vernon Cooke, Tigard, OR (US); Spencer Barrett, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 303 days.

(21) Appl. No.: 12/732,002

(22) Filed: Mar. 25, 2010

(65) Prior Publication Data
US 2010/0256802 A1 Oct. 7, 2010

Related U.S. Application Data

(60) Provisional application No. 61/163,550, filed on Mar. 26, 2009.

(51) Int. Cl.
*G01R 31/20* (2006.01)
(52) U.S. Cl. .......... 324/757.01; 324/757.04; 324/759.03
(58) Field of Classification Search .................. None
See application file for complete search history.

(56) References Cited

U.S. PATENT DOCUMENTS

| | | | |
|---|---|---|---|
| 3,142,382 A * | 7/1964 | Knowles et al. | ............... 209/556 |
| 3,583,548 A | 6/1971 | Cadwallader | |
| 3,664,499 A | 5/1972 | Sahakian | |
| 4,179,032 A | 12/1979 | Artz et al. | |
| 4,611,116 A | 9/1986 | Batt | |
| 4,747,479 A | 5/1988 | Herrman | |
| 4,818,382 A | 4/1989 | Anderson et al. | |
| 5,631,571 A | 5/1997 | Spaziani et al. | |
| 5,842,579 A * | 12/1998 | Garcia et al. | ................... 209/573 |
| 6,220,481 B1 | 4/2001 | Miyamoto | |
| 6,229,323 B1 | 5/2001 | Tverdy et al. | |
| 6,806,725 B2 | 10/2004 | Tsui et al. | |
| 6,967,475 B2 | 11/2005 | Tsui et al. | |
| 7,119,299 B2 | 10/2006 | Kojima | |
| 7,390,158 B2 | 6/2008 | Takagi | |
| 7,851,721 B2 * | 12/2010 | Sze et al. | ....................... 209/573 |

OTHER PUBLICATIONS

International Search Report of PCT/US2010/028827, 3 pages.

* cited by examiner

*Primary Examiner* — Minh N Tang

(57) ABSTRACT

An improved method and apparatus for testing and sorting electro-optic devices by both electrical and optical properties at high speed is disclosed. Electro-optic devices, in particular light emitting diodes, are singulated by a singulation device and transferred to a linear track where they are tested for electrical and optical properties. The devices are then sorted into a large number of different bins depending upon the tested properties.

19 Claims, 10 Drawing Sheets

US 8,305,104 B2

TESTING AND SORTING SYSTEM HAVING A LINEAR TRACK AND METHOD OF USING THE SAME

This patent application claims benefit of U.S. Provisional Application No. 61/163,550, filed Mar. 26, 2009.

TECHNICAL FIELD

The present invention regards systems and methods for testing and sorting miniature electronic devices. In particular it regards systems and methods for testing electrical and optical properties of light emitting diodes (LEDs). In more particular it regards a system and method for testing LED electrical and optical properties at high speed and sorting them into a large number of categories according to those properties.

BACKGROUND OF THE INVENTION

Many electronic devices are tested for electrical and optical properties during manufacturing by automated test systems. Typical automatic test systems use precision electrical or optical test equipment to find values associated with electrical and optical properties of a device and either accept, reject or sort it into an output category depending upon the measured values. For miniature devices, automatic test systems are often designed to handle bulk loads, where the manufacturing process creates a volume of devices which have substantially identical mechanical characteristics such as size and shape but differ in electrical or optical characteristics. It is common practice to build a volume of devices with electrical and optical properties which generally fall within a range and rely on testing to sort the devices into commercially useful groups with similar characteristics.

These devices are often supplied to the test equipment as containers filled with devices. Typically the test equipment must extract a single device from the bulk load of devices, orient the device and fixture it so the test equipment can perform the desired tests. Testing often requires probing the device, wherein electrical leads are brought into contact with device to permit signals and power to be applied to the device and to monitor responses to the inputs. Other tests involve measuring light output from optical devices such as LEDs in response to specific inputs. The task of the automatic test system is to determine the electrical or optical characteristics of devices and sort the devices into groups depending upon those characteristics.

Testing and sorting LEDs is particularly challenging because the wide variance in manufacturing tolerances and the sensitivity of the human eye to small variations in light output combine to require that LEDs be tested and sorted into a large number of output groups. While passive electronic devices might typically require five or ten output categories, LEDs might typically require in excess of 32 output categories up to as many as 512 categories. Other challenges associated with testing and sorting LEDs includes the fact that LEDs need to have their light output tested. Since LEDs can have contacts on one side of the package and light emitting surfaces on the other, the test equipment must probe from one side and collect light output from the other. Another challenge is that light output test equipment is often physically large and needs to be in proximity to the LED under test, which constrains the physical layout of the test equipment. In addition, if parallel testing is to be performed, where multiple test stations are arranged to test multiple devices simultaneously, room for multiple bulky optical test stations needs to be arranged.

Rotary feeders have been recognized as an efficient way to load and orient small parts. U.S. Pat. No. 6,220,481 SEPARATING FEEDER FOR CHIP COMPONENTS, inventor Masayuki Miyamoto, Apr. 24, 2001 uses a rotating grooved disk to orient and load parts into cavities which maintain the part orientation. U.S. Pat. No. 7,119,299 WORK INSPECTION SYSTEM, inventor Tomoyuki Kojima, Hiroaki Abe, Shigeru Matsukawa, Takahiko Iwazaki and Takayuki Yamauchi, Oct. 11, 2006 describes a system with a vertical rotary disk to orient and hold parts delivered by gravity to a face of the disk. U.S. Pat. No. 5,842,579 ELECTRICAL CIRCUIT COMPONENT HANDLER, inventors Douglas J. Garcia, Steven D. Swendrowski, Mitsuaki Tani, Hsang Wang, Martin J. Twite, III, Malcolm Hawkes, Evart David Shealey, Martin S. Voshell, Jeffrey L. Fish and Vernon P. Cooke, Dec. 1, 1998, assigned to the assignee of this invention, discloses a rotary disk test machine with multiple tracks able to test multiple parts at once. U.S. Pat. No. 4,747,479 DEVICE FOR THE TESTING AND/OR PROCESSING OF SMALL COMPONENT PARTS, inventor Jakob Herrman, May 31, 1988 discloses a linear belt to hold parts under test. What these disclosures do not consider are the particular demands that testing LEDs places on equipment including requirements for accessible fixturing, the need for large numbers of output bins and handling large and bulky optical test equipment.

In particular it is desirable to sort electro-optic devices such as singulated LEDs into groups depending upon electrical and/or optical properties. One system designed to perform such sorting is the LED Die Brightness/Wavelength Sorter Mode ALPHA 3200/3200F manufactured by E-Globaledge Corporation, Tokyo, Japan. This system measures an LED die's brightness and wavelength output at the same time and classifies them into a maximum of 32 tracks. It performs the optical tests in 0.8 seconds, while performing no electrical tests. Assuming an overhead factor of 50% to perform indexing of the LED to and from the test station, this would yield a system throughput of about 3000 units per hour (UPH). It would be desirable to be able to test both electrical and optical properties of an LED with the same system in order to save expense and floor space in the test facility. It would also be desirable to be able to test and sort LEDs at a much higher rate of speed in order to minimize the number of systems required to test and sort a given production volume of LEDs. In addition it would be desirable to be able to sort the tested LEDs into more than 32 different categories.

What is needed, then, is an LED test and sort system that can test both electrical and optical properties of an LED, test and sort them at high speed and sort them into more than 32 different categories following testing.

SUMMARY OF THE INVENTION

Aspects of the instant invention provide an improved method of sorting electro-optic devices based on electrical and optical properties using an automated test system. The improvements include singulating said electro-optic devices with a rotary singulation device; transferring said singulated electro-optic devices onto a linear track; measuring an electrical property of said electro-optic devices at a first test station as said linear track indexes said electro-optic component into proximity with said first test station; storing said electrical property measurements on said controller; measuring an optical property of said electro-optic devices at a second test station as said linear track indexes said electro-optic devices into proximity with said second test station; storing said optical property measurements on said controller. The improvements further include sorting the electro-optic devices by removing them from the linear track at one of a plurality of sorting stations adjacent to said linear track as said linear track indexes at a high rate of speed. The sorting stations are controlled by the controller to sort the devices according to the stored electrical and optical property measurements, wherein the sorting stations are capable of sorting the devices into more than 32 bins.

To achieve the foregoing and other objects in accordance with the purposes of the present invention, as embodied and broadly described herein, a method and apparatus is disclosed.

DETAILED DESCRIPTION OF PREFERRED EMBODIMENTS

This invention is an improved system and methods for testing and sorting of miniature electronic devices such as Light Emitting Diodes (LEDs). An improved method of testing and sorting an electronic device having first and second properties using an automated test system is disclosed. The system includes one or more rotary singulation mechanisms, a linear track, first and second test stations, and at least one sorting bin, all in communication with a controller. The system singulates the electronic devices with one or more rotary singulation mechanisms. The system then transfers the singulated electronic devices from the one or more rotary singulation mechanisms onto the linear track. The linear track indexes to bring the electronic devices into proximity with the first test station where the first property of the device is tested and the test results stored on the controller. The linear track then indexes to bring the electronic devices into proximity with the second test station where the second property of the electronic devices is tested and the test results stored on the controller. The system then indexes the linear track to bring the electronic devices into proximity with at least one sorting bin, whereupon the controller directs the sorting bin to acquire said electronic device from said track in response to the stored first and second test results thereby sorting said electronic devices.

Figure 1:
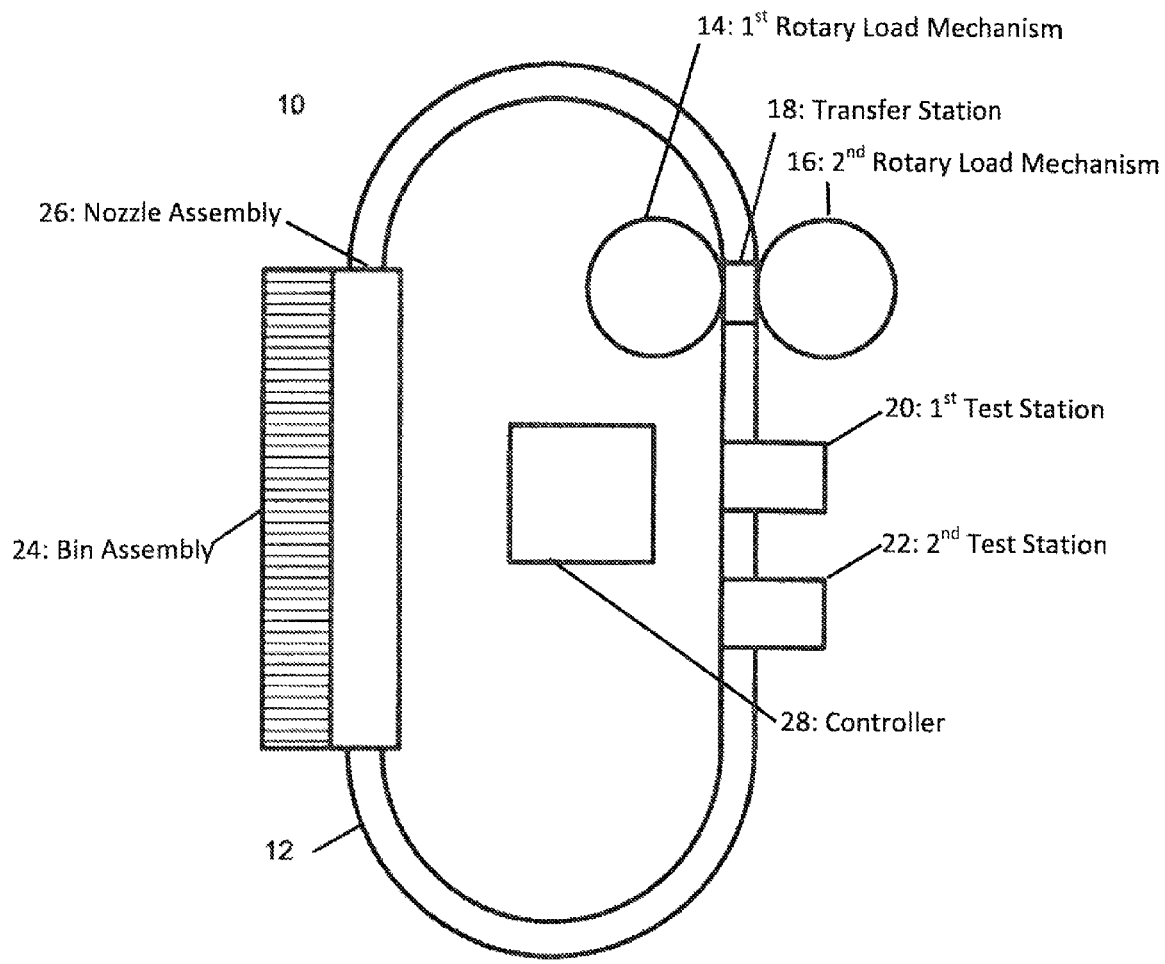
FIG. 1. Automated test system
FIG. 2. Dual rotary feeders
FIG. 3. Transfer station
FIG. 4. Optional transfer station
FIG. 5. "V" shaped track option
FIG. 6. Electrical test station
FIG. 7. Optical test station
FIG. 8. Eject station
FIG. 9. System cycle timing
FIG. 10. Test cycle timing

FIG. 1 shows an embodiment of this invention comprising an automated test system 10. This embodiment includes a linear track 12, a rotary load mechanism 14 and a second optional rotary load mechanism 16. The linear track 12 can be configured to load from one rotary loader or two. The rotary loaders 14, 16 are operatively connected to the linear track 12 by the transfer station 18. In operation bulk devices are loaded into the rotary load mechanisms 14, 16, where they are singulated. Following singulation, the devices (not shown) are transferred from the rotary loader 14, 16 to the linear track 12 at the transfer station 18. The linear track 12 indexes, or moves a predetermined amount along a route, moving the loaded devices (not shown) along the route into proximity with the first test station 20, where they are tested and the results transmitted to controller 28. The linear track 12 then indexes the parts along the route into proximity with the second test station 22 where they are tested and the results sent to the controller 28. The linear track then indexes the devices (not shown) along the route to the nozzle assembly 26, where the controller 28 directs the nozzle assembly 26 to eject the device from the linear track 12 into the correct part of the bin assembly 24, which has a plurality of bins. The controller 28 is operatively connected to the linear track 12, the rotary loaders 14, 16, the transfer station 18, the test stations 20, 22, the nozzle assembly 26 and the bin assembly 24 to sense and control the operations of each.

Figure 2:
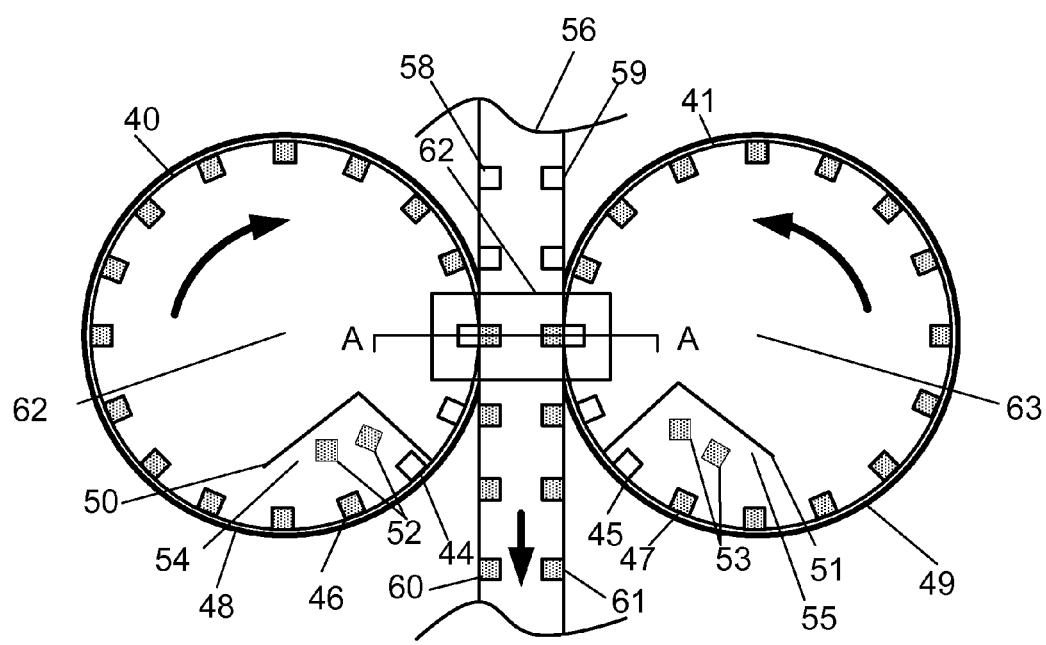

FIG. 2 shows how the rotary load wheels 40, 41 which singulate and transfer bulk parts 52, 53 to the linear track 56. Note that the figure shows two rotary loaders however an embodiment of this invention can have only one loader 40 and a single sided linear track 56. Also, other types of feeders, in particular vibratory bowl feeders may be advantageously employed. Singulation refers to the separation of bulk devices into individually fixtured parts. FIG. 2 shows bulk devices 52, 53 loaded into the load area 54, 55 of the rotary load wheel 40, 41 defined by the load fence 50, 51. The rotary load wheel has load slots 44, 45, 46, 47 around the rim. The load fence keeps the bulk devices 52, 53 within the load area 54, 55 until such time as they individually are lead by gravity to be accepted into an empty load slot 44, 45 as the rotary load wheel 40, 41 indexes around their respective axes 62, 63 in the directions of the arrows. The devices are held in place by the load wheel rim 48, 49, which forms an outside support for at least the load area 54, 55 to prevent devices from falling off the edge of the rotary load wheel 40, 41. FIG. 2 shows devices loaded into the load slots 46, 47 of the rotary load wheel 40, 41. As the rotary load wheel 40, 41 indexes around, the loaded slots 46, 47 are brought into position AA. The linear track 56 indexes along with the rotary load wheels 40, 41 in the direction of the arrow, thereby bringing empty track slots 58, 59 into registration with the loaded slots 46, 47 at location AA in the transfer station 62, where the devices are transferred from the loaded slots 46, 47 to form loaded track slots 60, 61, which are then indexed away from the transfer station 62.

Figure 3:
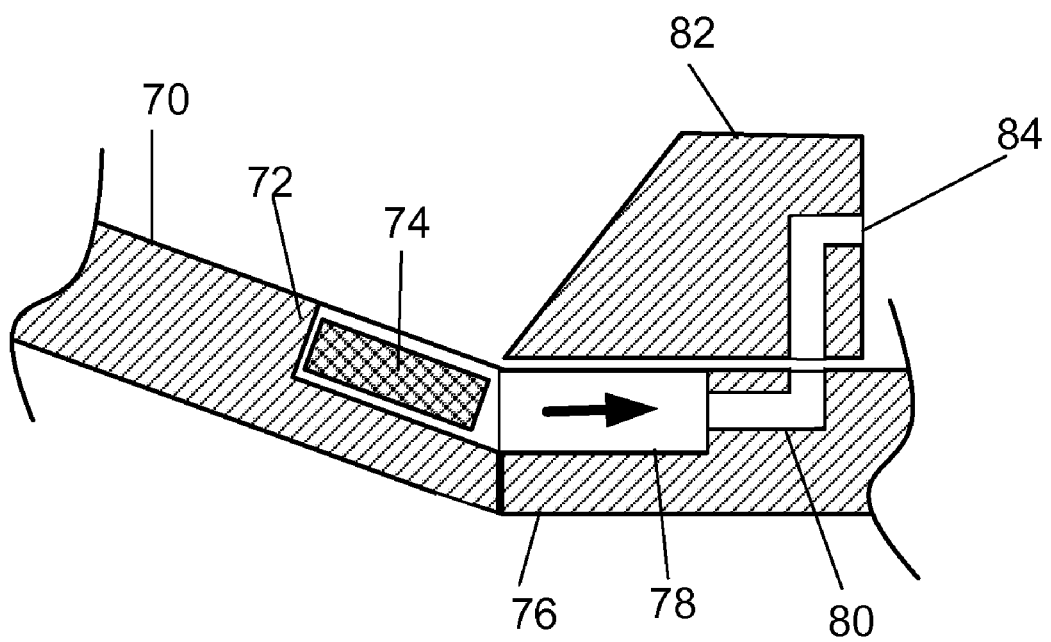

FIG. 3 shows details of the transfer station for an embodiment of this invention. In FIG. 3, a cross-section of a part of a rotary load wheel 70 is shown, along with a load slot 72, containing a device 74. This cross-section is a portion of the view along line AA in FIG. 2. A cross-section of a portion of the linear track 76 is shown, along with an empty track slot 78. With the linear track 76 in position adjacent to the transfer block 82, the transfer block 82 forms a seal on the open track slot 78. This permits the transfer block 82 to pull a vacuum from a vacuum source (not shown) through the transfer channel 84 to the track channel 80, which pulls the device 74 in the direction of the arrow out of the load slot 72 into the track slot 76.

Figure 4:
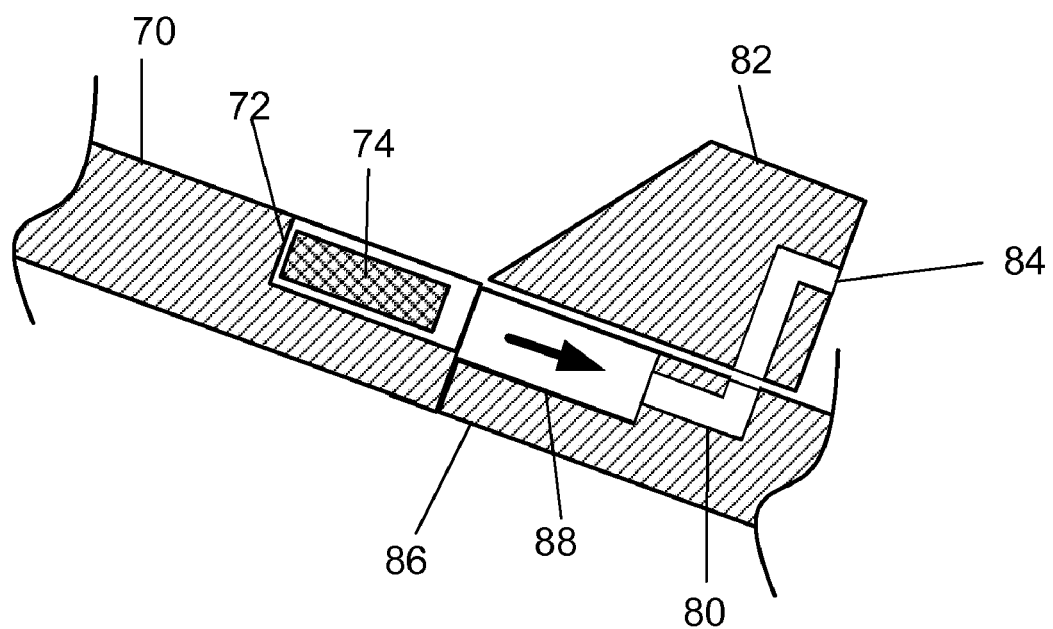
Figure 5:
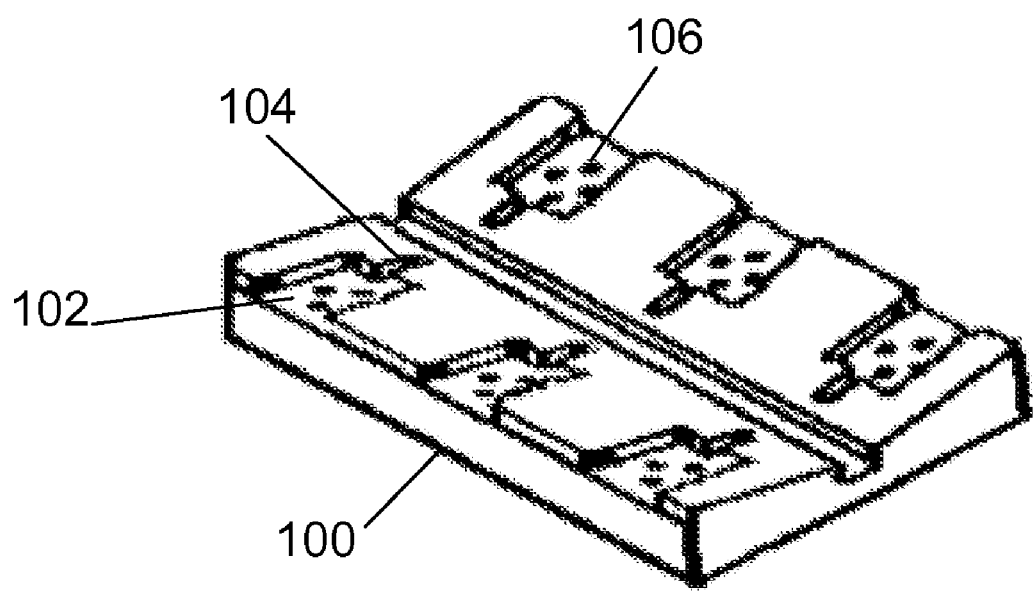

FIG. 4 shows an additional embodiment of this invention where the track section (also referred to herein as a "track section" or "track body") 86 is angled to meet the angle of the rotary load wheel 70, thereby assisting the transfer of the device 74 from the load slot 72 to the track slot 88. Note that the track and the loader may assume any angle deemed to be effective. Also, the transfer of the device from the loader to the track may be by gravity alone or be assisted by vacuum or compressed air. FIG. 5 is a diagram showing an embodiment of this invention that combines the dual track mechanism with the angled track mechanism. In FIG. 5, a section of track (or track body) 100 shows three track slots 102 on each side along with six track channels 104 and probe holes 106. The track slots 102 require probe holes 106 because typical electro-optic devices such as LEDs emit light from one surface (the top) and have electrical contacts on the opposite side of the package (the bottom). In this way the top of the device is available for light measurements and the bottom is available for probing via the probe holes 106. These track sections (or track bodies) would be joined together, supported and driven by suitable mechanisms to form a linear track in the form of an oval, wherein the track sections (or track bodies) would remain substantially horizontal and thereby not require that the devices be captured or otherwise prevented from falling from the track as it would if the track were an endless belt that inverted the track.

Figure 6:
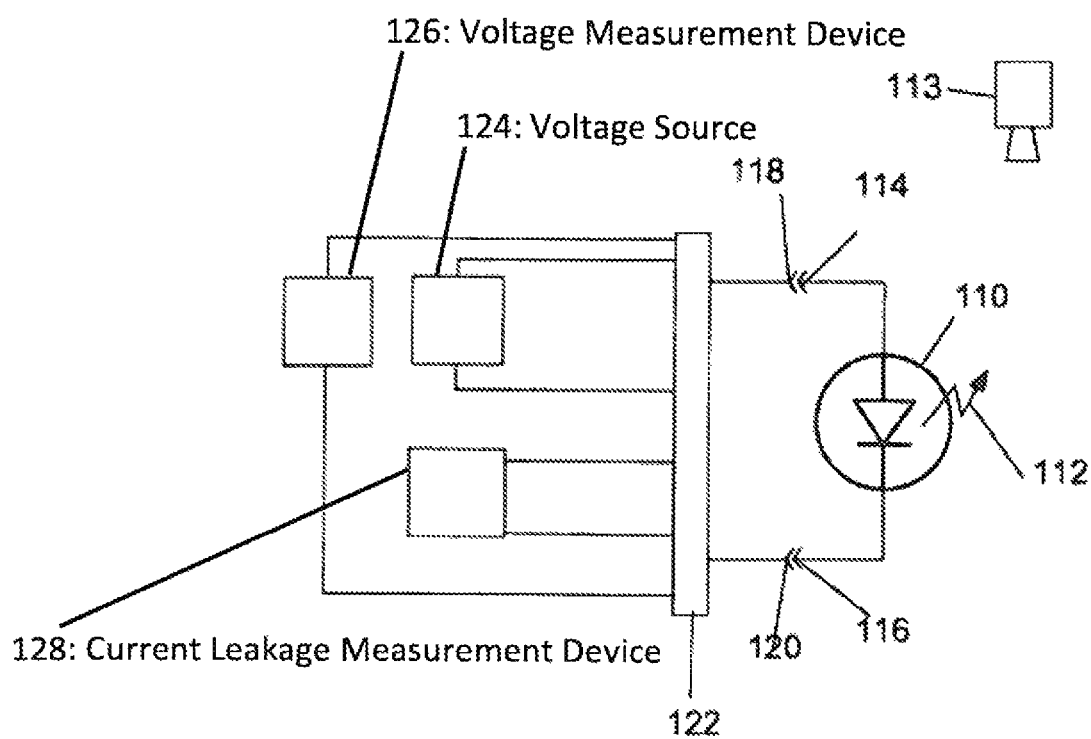

Embodiments of this invention measure devices for parameters such as forward operating voltage and electrical current draw. The LEDs are also measured for light output parameters such as luminous flux and spectral light output. FIG. 6 shows an exemplary electrical test station as embodied in this invention. FIG. 6 shows a device 110 under test, possibly emitting light 112 which can be measured by an optical instrument 113 operatively connected to the controller 28. Leads 114, 116 on the device are connected to test leads 118, 120, which may be Kelvin connectors. The test leads are connected to the relay block, which, under control of the controller 28 switches between the voltage source, 124, a voltage measurement device 126 and a current leakage measurement device 128, all operatively connected to the controller 28. An exemplary device which can perform these functions is the Model 616 Test and Measurement Source, manufactured by Electro Scientific Industries, Inc. Portland Oreg., 97239.

Figure 7A:
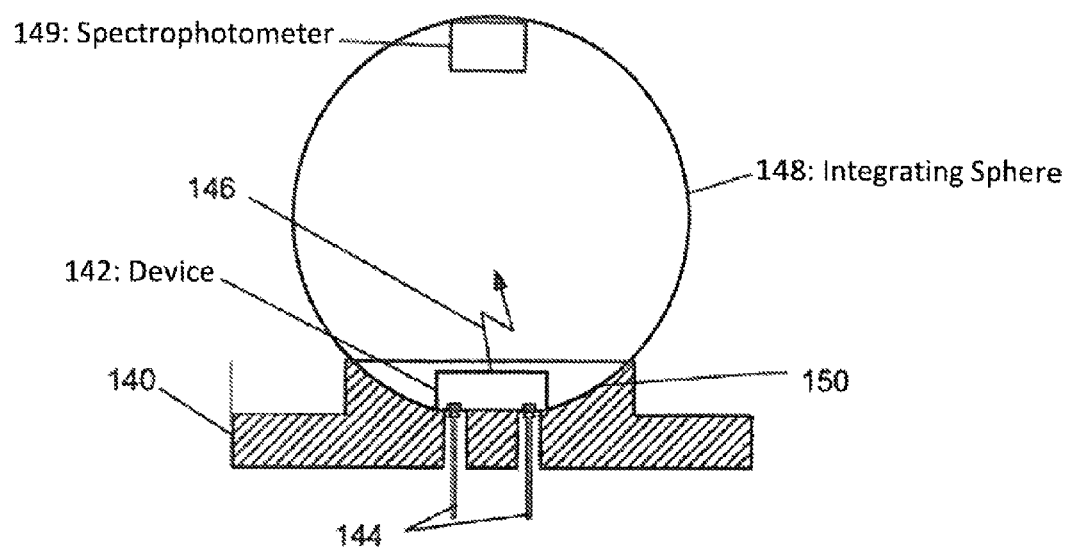
Figure 7B:
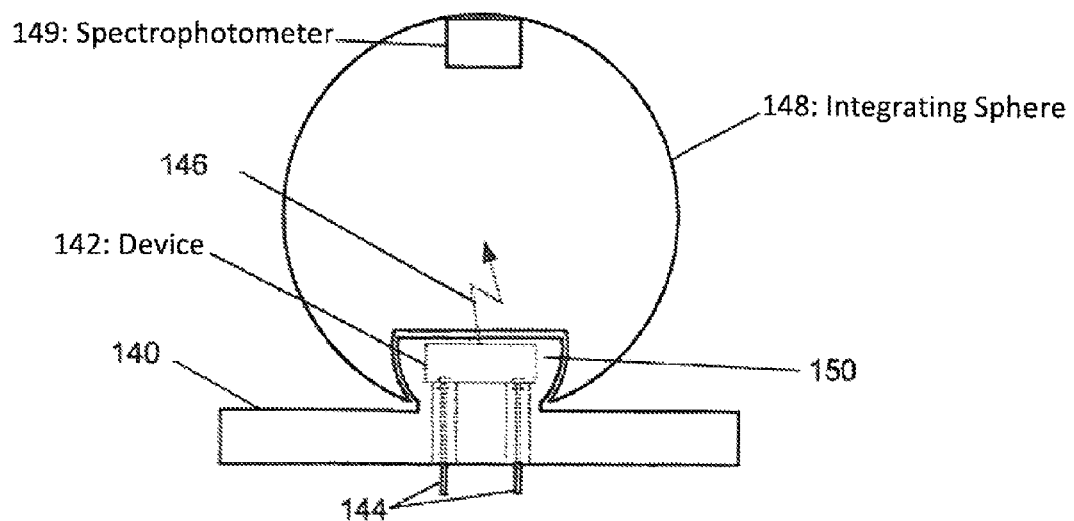

FIGS. 7a and 7b show an exemplary optical test station of an embodiment of this invention. FIG. 7a shows a cross-sectional view of a section of linear track 140, viewed parallel to the direction of travel with a device under test 142 being tested using test leads 144. The device 142 is possibly emitting light 146 in response to test signals from test leads 144. The resulting light emissions 146 are being measured by a spectrophotometer 149 in an integrating sphere 148. Note that part of the interior surface of the integrating sphere is being supplied by a portion 150 of the section of linear track 140. FIG. 7b is another view of the same optical test station as FIG. 7a, viewed parallel to the direction of travel. Exemplary testing performed by an embodiment of this invention is show in Table 1.

TABLE 1

| | |
|---|---|
| Electrical | Forward Voltage ($V_F$) |
| | Reverse Current ($I_R$) |
| Brightness | Luminous Intensity ($I_V$) |
| | Luminous Flux ($\phi V$) ($2\pi$) |
| Wavelength/Color | Spectrum XYZ |
| | Peak, Dominant Wavelength |
| | Purity, CCT, (R1 to R8), CRI |
| Max Forward Current supplied for optical tests | 1000 mA |

In Table 1, Forward voltage is measured in volts and refers to the forward voltage drop associated with a diode such as an LED. Reverse current is measured in amperes and is the amount of current that flows when the diode voltage is reversed. Luminous intensity is measured in candelas and is a measure of the wavelength-weighted power emitted by the LED per unit solid angle. Luminous flux is measured in lumens and is a measure of the total power of light emitted adjusted for the sensitivity of the human eye. The Spectrum XYZ refers to measuring the color output of a device according to the CIE 1931 XYZ color space model. Peak wavelength refers the single wavelength having the greatest amount of power. Dominant wavelength refers to the single wavelength that appears to be the brightest to the human eye. Purity refers to the extent to which the device creates a single color. CCT refers to correlated color temperature which is the temperature at which a black body would radiate a similar color. CRI refers to the color rendering index or the ability of a light source to render colors of objects as compared to an ideal source. R1 to R8 refers to the eight standard samples that are used to calculate the CRI. Equipment and algorithms used to calculate these values are well known in the art and will not be described herein.

Figure 8:
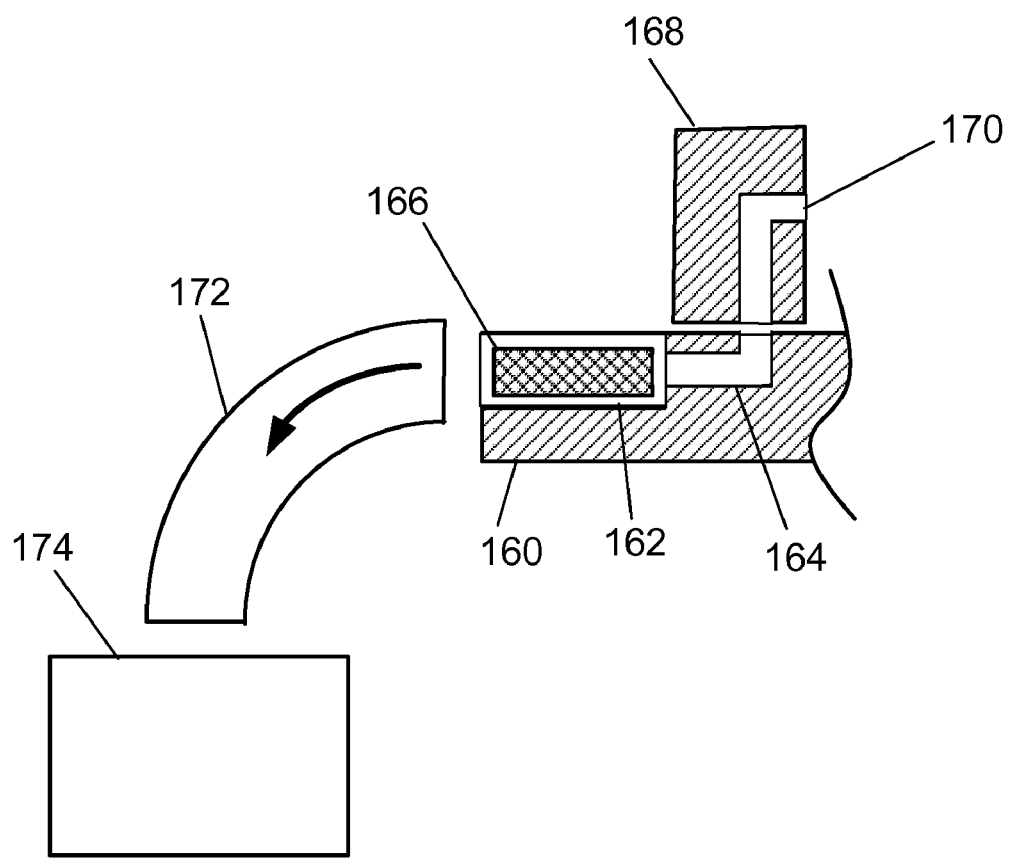

In an embodiment of this invention, following electrical and optical testing, each device is sorted in one of a large number of bins of bin assembly 24 by the nozzle assembly 26. FIG. 8 shows an embodiment of this invention where a section of track 160 having a slot 162 and a channel 164 with a device 166 therein. The track 160 is indexed under command of the controller 28 to move adjacent to the eject block 168 having an eject channel 170. Air under pressure is supplied (not shown) to the eject channel 170, which travels through the track channel 164 ejecting the device 166 into the eject nozzle 172 and thence into a bin 174. Embodiments of this invention have greater than 32 and as many as 512 eject nozzles and bins to sort devices.

Figure 9:
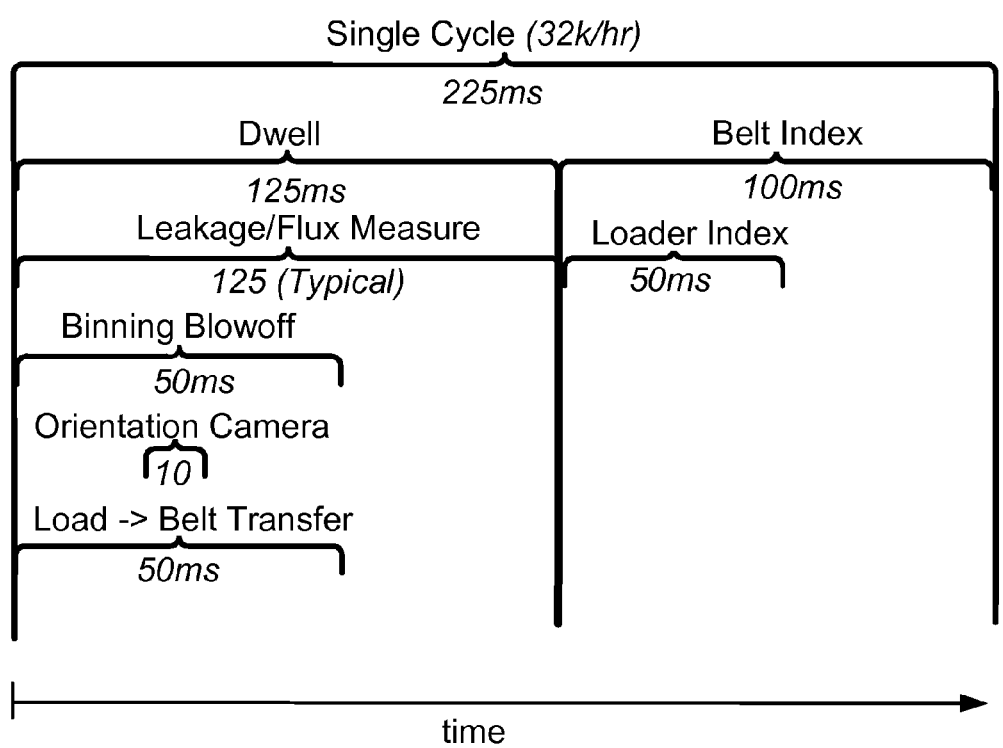
Figure 10:
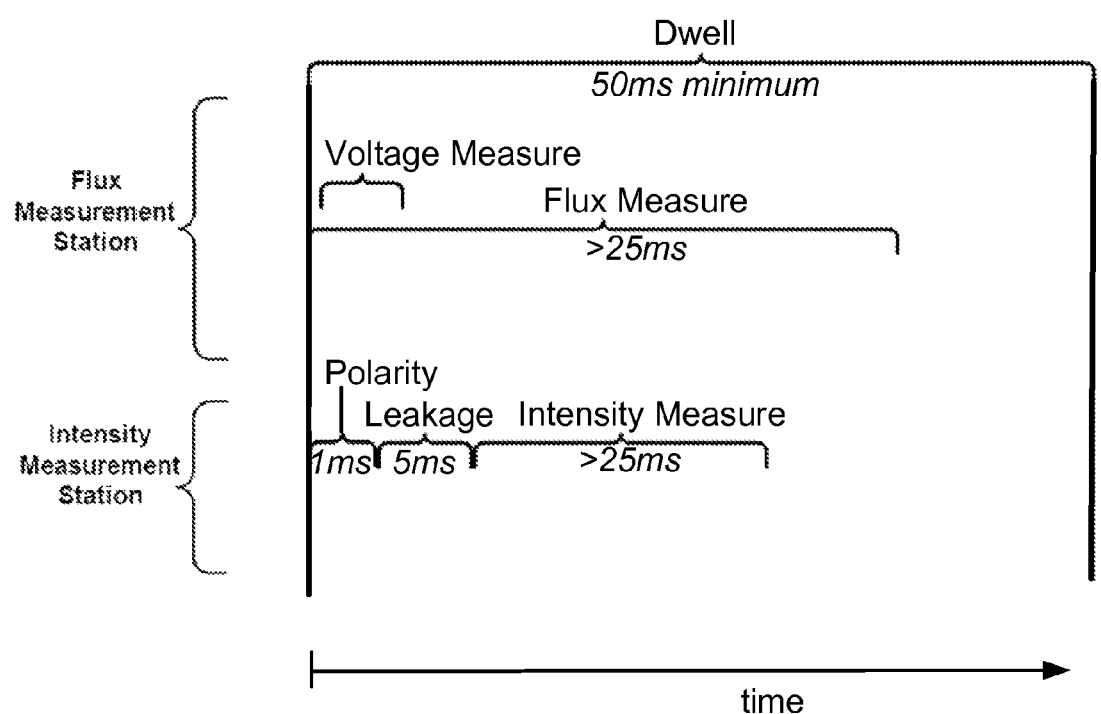

FIG. 9 shows exemplary cycle times for an embodiment of this invention. A throughput of 32,000 devices per hour allows a cycle time of 225 ms per device for each step in the process. FIG. 9 shows that the belt which carries the track sections 100 which comprise the track 12 needs 100 ms to index from one position to the next, leaving 125 ms for each step. This is consistent with the amount of time it takes the rotary load wheel 14, 16 to index to the next position (50 ms) and the amount of time require for leakage/flux measurement (125 ms). This is also sufficient time for binning blow-off as shown in FIG. 8, optional orientation of the device by machine vision and transfer from rotary load wheel 40, 41 to linear track 56. FIG. 10 shows the minimum dwell time, or the amount of time a device remains stationary adjacent to a particular station, of 50 ms being sufficient for both flux measurement (>25 ms) and intensity measurement, which includes of polarity, leakage and intensity measurements (>25 ms).

It will be apparent to those of ordinary skill in the art that many changes may be made to the details of the above-described embodiments of this invention without departing from the underlying principles thereof. The scope of the present invention should, therefore, be determined only by the following claims.

We claim:

1. An improved method of testing and sorting an electronic device using an automated test system, the improvements comprising:

providing said automated test system with a singulation mechanism, a linear track having a track body movable along a route, at least one test station and a plurality of sorting stations, all in communication with a controller, and a plurality of sorting bins;

singulating said electronic device with said singulation mechanism;

transferring said singulated electronic device from said singulation mechanism onto a portion of said track body;

indexing said portion of said track body along the route to bring said singulated electronic device into proximity with said at least one test station;

testing a property of said singulated electronic device with said at least one test station;

storing a result of said testing on said controller;

indexing said portion of said track body along the route to bring said singulated electronic device into proximity with one of said plurality of sorting stations; and at said one of said plurality of sorting stations, transferring said singulated electronic device from said portion of said track body to one of said plurality of sorting bins in response to said stored result of said testing thereby sorting said singulated electronic device.

2. The method of claim 1 wherein said singulated electronic device is a light emitting diode.

3. The method of claim 1 wherein said route is continuous and indexing said portion of said track body along the route includes moving said singulated electronic device in a plane.

4. The method of claim 1 wherein testing said property of said singulated electronic device with said at least one test station comprises testing an electrical property of said singulated electronic device.

5. The method of claim 1 wherein testing said property of said singulated electronic device with said at least one test station comprises testing an optical property of said singulated electronic device.

6. The method of claim 1 wherein said plurality of sorting bins includes 32 sorting bins.

7. The method of claim 1, wherein said singulation mechanism is a rotary singulation mechanism.

8. The method of claim 1, wherein indexing said portion of said track body along the route to bring said electronic device into proximity with said at least one test station includes translating said portion of said track body along the route.

9. The method of claim 1, wherein indexing said portion of said track body along the route to bring said electronic device into proximity with said one of said plurality of sorting stations includes translating said portion of said track body along the route.

10. An improved automatic test system for testing and sorting an electronic device, the improvements comprising:

a linear track having a track body that is movable along a route;

a singulation mechanism configured to singulate an electronic device;

a transfer station configured to transfer said singulated electronic device onto a portion of said track body;

at least one test station configured to test a property of said singulated electronic device;

a plurality of sorting bins;

a plurality of sorting stations, wherein each sorting station in the plurality of sorting stations is configured to transfer said singulated electronic device from said portion of said track body to one of the plurality of sorting bins; and a controller in operative communication with said singulation mechanism, linear track, said at least one test station and said plurality of sorting stations, wherein said controller is configured to index said portion of said track body along said route into proximity with said at least one test station, wherein said controller is configured to index said portion of said track body along said route into proximity with one of said plurality of sorting stations, and wherein said controller is configured to control said one of said plurality of sorting stations to sort said electronic device into one of said plurality of sorting bins depending upon said tested property of said singulated electronic device.

11. The system of claim 10 wherein said singulated electronic device is a light emitting diode.

12. The system of claim 10 wherein said linear track is continuous and moves said singulated electrical device in a plane.

13. The system of claim 10 wherein said at least one test station includes a test station configured to test an electrical property of said singulated electronic device.

14. The system of claim 10 wherein said singulated electronic device is an electro-optic component, and wherein said at least one test station includes a test station configured to test an optical property of said electro-optic component.

15. The system of claim 10, wherein said singulation mechanism is a rotary singulation mechanism.

16. The system of claim 10, wherein said portion of said track body is linearly translatable along the route to be in proximity with said at least one test station.

17. The system of claim 10, wherein said portion of said track body is linearly translatable along the route to be in proximity with said one of said plurality of sorting stations.

18. The system of claim 10, wherein said track body includes a slot configured to receive said singulated electronic device.

19. The system of claim 18, wherein said track body includes a probe hole communicating with the slot, the probe hole configured to receive a test lead from the at least one test station.

* * * * *